United States Patent [19]

Liu

[11] Patent Number: 5,423,605
[45] Date of Patent: Jun. 13, 1995

[54] FRONT PANEL STRUCTURE FOR A PERSONAL COMPUTER

[75] Inventor: Morgan C. Liu, Taoyuan, Taiwan, Prov. of China

[73] Assignee: Enlight Corporation, Taoyuan, Taiwan, Prov. of China

[21] Appl. No.: 62,296

[22] Filed: May 14, 1993

[51] Int. Cl.⁶ ............................................. A47B 47/00
[52] U.S. Cl. .................................. 312/265.6; 312/111; 361/683
[58] Field of Search ................................ 361/300–302, 361/395, 687; 312/111, 257.1, 263, 330, 257 R, 265.6; 439/345, 347, 223

[56] References Cited

U.S. PATENT DOCUMENTS

| | | | |
|---|---|---|---|
| 3,976,344 | 8/1976 | Frydman | 312/265.5 X |
| 4,723,820 | 2/1988 | Kroneck | 312/265.6 X |
| 4,964,017 | 10/1989 | Jindrick et al. | 361/390 |
| 5,267,873 | 12/1993 | Provenzale | 439/347 |
| 5,282,114 | 1/1994 | Stone | 361/687 |

*Primary Examiner*—Stephen C. Pellegrino
*Assistant Examiner*—Nancy Mulcare
*Attorney, Agent, or Firm*—Ladas & Parry

[57] ABSTRACT

A front panel structure of a personal computer comprises upper hooking members and lower hooking members to secure the front panel to the casing of the personal computer in order to provide a fast and efficient way for mounting/dismounting the front panel. Four resilient upper hooking members are provided on the top edge of the front panel to be received within four corresponding upper slots formed on the computer casing and two resilient hooking members are formed on the lower edge of the front panel to be received within two corresponding lower openings formed on the computer casing to cooperate with the upper hooking members for securing the front panel on the computer casing. Several guiding and supporting tabs are provided to guide the mounting of the front panel and to further secure the front panel in position. With such an arrangement, by depressing the resilient hooking members to have the hooking members disengage from the openings of the computer casing, the front panel can be easily removed from the computer casing.

5 Claims, 4 Drawing Sheets

FRONT PANEL STRUCTURE FOR A PERSONAL COMPUTER

FIELD OF THE INVENTION

The present invention relates generally to a front panel structure of a personal computer and in particular a front panel which is mounted on the computer casing by means of snap-on type fastening means.

BACKGROUND OF THE INVENTION

With the development of more powerful personal computers, personal computers are getting more broadly used in academic fields, industries, businesses and homes. Due to the broad application of personal computers, maintenance and repairing of personal computers have become an important factor in purchasing computers. Conventionally, the mechanical and electronic parts of a personal computer are assembled and secured by screw type fasteners. Such an assemblage has the disadvantage of inconvenience due to the labor- and time-consuming work of tightening and loosening the screws.

It is therefore desirable to have a front panel structure which provides an easy assembly onto the computer casing and no separate fastening means, such as screws, is required so as to enhance the assembly/disassembly thereof and thus reducing the time and cost required for computer maintenance.

OBJECTS OF THE INVENTION

The principal object of the present invention is to provide a front panel structure for a personal computer comprising snap-on type fastening means to provide a fast securing of the front panel on the casing of the personal computer so as to cut down the assembly and parts cost in manufacturing.

It is another object of the present invention to provide a front panel structure for a personal computer comprising snap-on type fastening means so that by depressing the resilient parts of the fastening means, the front panel can be easily dismounted and thus providing an efficient way for conducting maintenance, repairing and parts expansion of the personal computer.

It is also an object of the present invention to provide a front panel structure for a personal computer which comprises snap-on type fastening means to replace the conventional screw type fasteners in order to overcome problems induced by the screws.

Other objects and advantages of the invention will be apparent from the following description of a preferred embodiment taken in connection with the accompanying drawings.

Figure 1:
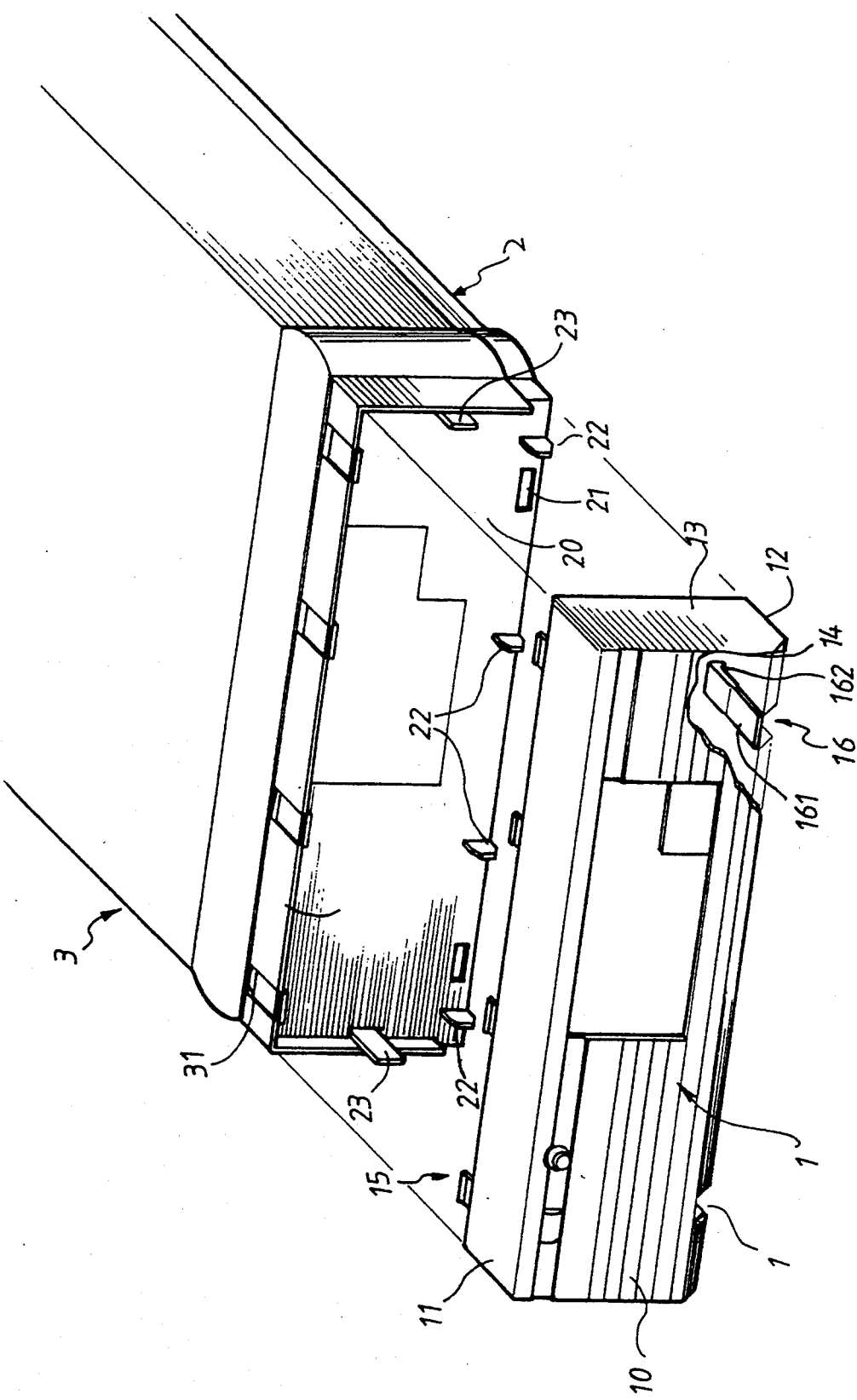
FIG. 1 is a fragmentary perspective view showing a front panel structure for a personal computer made in accordance with the present invention, wherein only a portion of the computer is illustrated.

DESCRIPTION OF THE REFERENCE NUMERALS (1) front panel
(10) panel body
(11) top flange
(12) bottom flange
(13) side flange
(14) inclined surface
(15) upper hooking means
(16) lower hooking means
(17) notched support member
(18) notch
(2) base casing
(20) front side portion
(21) opening
(22) Guiding tab
(23) side tab
(3) cover casing
(30) front extension
(31) slot
(151) flexible strip-like base
(152) projecting hook
(161) strip
(162) projecting hook

DETAILED DESCRIPTION OF THE PREFERRED EMBODIMENT

With reference to the drawings and in particular to FIG. 1, wherein a front panel made in accordance with the present invention, generally designated with reference numeral 1, is shown dismounted from the housing of a personal computer which, in addition to the front panel 1, further comprises a base casing 2 and a cover casing 3, together defining an enclosure housing the electric and electronic parts of the computer. The front panel 1, preferably rectangular, comprises a panel body 10 having four edges respectively with a top flange 11, a bottom flange 12 and two opposite side flanges 13 attached thereon in a perpendicular manner to define a recess therebetween for receiving therein the front side of the computer casing.

Preferably, an inclined surface 14 with an inclination angle between 30 to 60 degrees is formed between the panel body 10 and the bottom flange 12.

Figure 2:
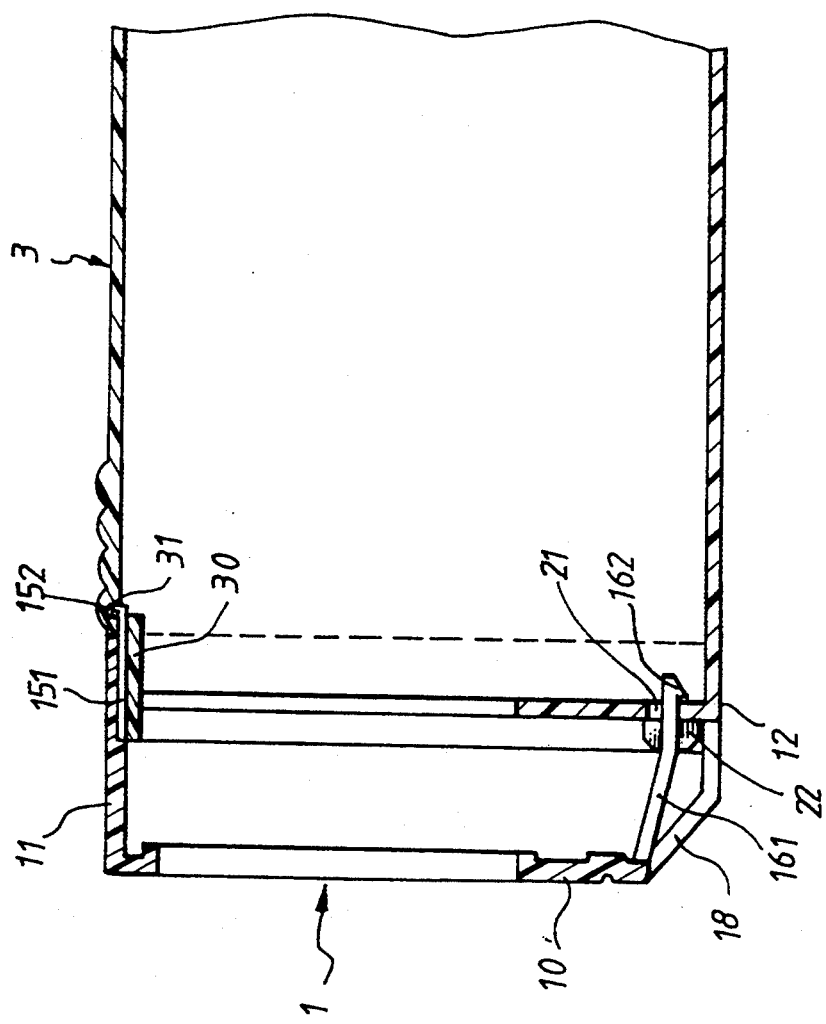
FIG. 2 is a lateral sectional view of the front panel structure shown in FIG. 1.

Further referring to FIG. 2, formed on the top flange 11 of the front panel 1 is upper hooking means 15 comprising at least two upper hooking members, each having a flexible strip-like base 151 extending from the top flange 11 with an upward projecting hook 152 on the free end thereof. Similarly, lower hooking means 16 is formed on the bottom flange 12 of the front panel 1, comprising a plurality of lower hooking members, preferably two, each having a flexible strip-like base 161 extending from each of a plurality of corresponding notches 18 formed on the inclined surface 14. Each of the strip-like bases 161 has a free end with a downward projecting hook 162 formed thereon.

Figure 3:
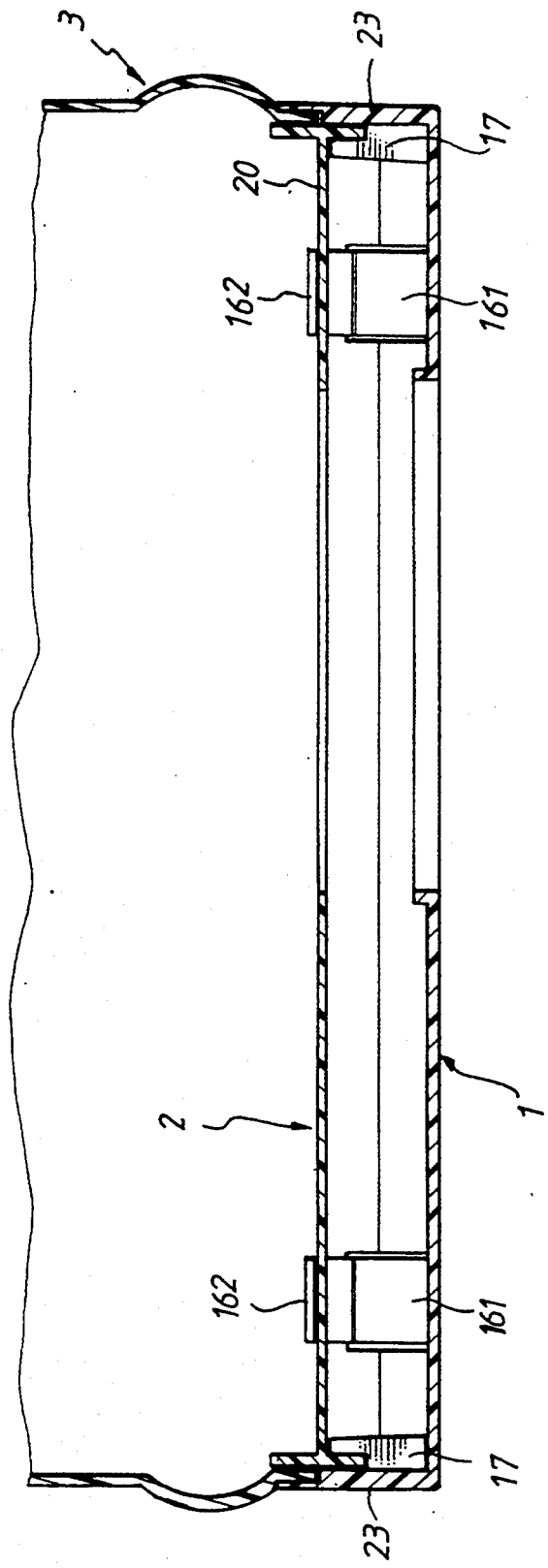
FIG. 3 is a horizontal sectional view of the front panel structure shown in FIG. 1.

Further referring to FIG. 3, inside the recess defined by the panel body 10 and the top flange 11, the bottom flange 12 and the side flanges 13, there is provided on the connection between the panel body 10 and each of the side flanges 13 at least a notched support member 17 with the notch thereof opened away from the panel body 10.

The base casing 2 comprises a front side portion 20 which extends between the front edges of the base casing 2 and the cover casing 3 and is received within the recess of the front panel 1 when the front panel 1 is mounted on the computer casing. On the front side portion 20 and in the vicinity of the front edge of the base casing 2, there are provided, corresponding to the lower hooking members of the lower hooking means 16, a plurality of openings 21 through which the strips 161 of the lower hooking members extend and the hooks 162 thereof are secured therein.

Guiding tabs 22 are also provided on the front side portion 20, in the vicinity of the front edge of the base casing 2, to guide the mounting of the front panel 1 and also support the front panel 1 in position of securely mounting on the computer casing. The guiding tabs 22 are horizontally spaced in a line, corresponding to the bottom flange 12 of the front panel 1 so as to rest on and thus tightly abut against the bottom flange 12 to secure the front panel 1 on the computer casing.

On the front side portion 20, there are provided, corresponding to the notched support members 17 of the front panel 1, side tabs 23 which are received within the notches of the notched support members 17 to support the front panel 1 on the computer casing.

Corresponding to the upper hooking members of the upper hooking means 15, there are provided a plurality of slots 31 on a front extension 30 of the cover casing 3 to receive therein the projecting hooks 152 of the upper hooking means and thus securing the front panel 1 on the computer casing.

Figure 4:
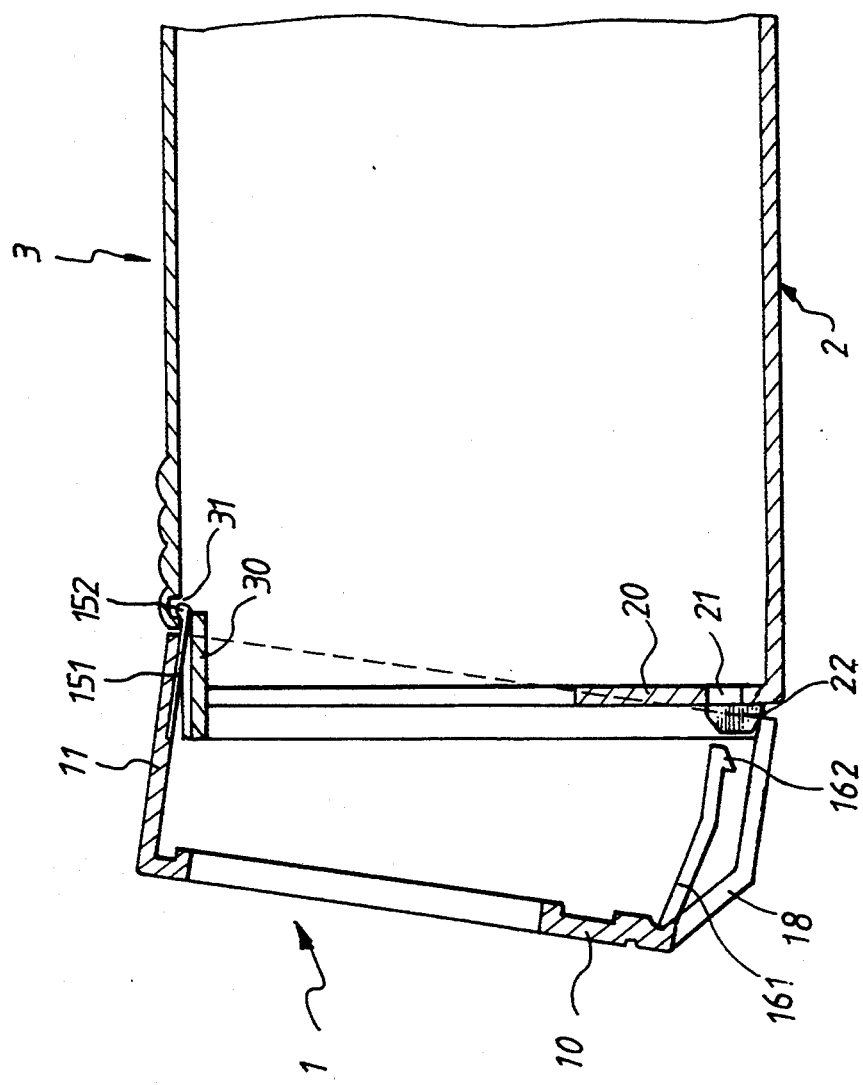
FIG. 4 is a lateral sectional view showing the mounting/dismounting of the front panel structure of the present invention.

Further referring to FIG. 4 which shows the mounting of the front panel 1 on the computer casing, the upper hooking members of the upper hooking means 15 are inserted into the slots 31 of the cover casing 3 in an inclined manner first. The front panel 1 is then rotated about the connections between the upper hooking means 15 and the slots 31 to have the bottom flange 12 move toward the base casing 1 and once the lower hooking means 16 approaches and contacts the lower openings 21 of the base casing 2, the flexible strips 161 are deformed and slightly upward bent to allow the hooks 162 thereof to slidably enter the openings 21. The entering of the hooks 162 into the openings 21 secures the front panel 1 on the computer casing. In the mean time, the side tabs 23 are also moved into the notches of the notched support members 17 to provide further support of the front panel 1 on the computer casing.

Preferably, the guiding tabs 22 are each provided with a chamfered edge to guide the approximating movement of the front panel 1 toward the base casing 2, as shown in FIG. 4, and to guide the bottom flange 12 into contact with the lower edges of the guiding tabs 22. By the chamfered edges, the bottom flange 12 are slightly deformed when getting into contact with the lower edges of the guiding tabs 22 so as to form a secure engagement therebetween to secure the front panel 1 on the computer casing.

In dismounting the front panel 1, a user may insert his fingers into the notches 18 of the front panel 1 to upward bend the flexible strips 161 of the lower hooking means 16 so as to allow the hooks 162 out of engagement with the lower openings 21 of the base casing 2. By moving the lower hooking means 16 out of the openings 21, the user may rotate the bottom flange 12 away from the base casing 2 to an inclined position as that shown in FIG. 4 and then withdraw the upper hooking means 15 out of the slots 31 of the cover casing 3 to completely dismount the front panel 1 from the computer casing.

In this way, a fast and simple means for mounting/dismounting a front panel to a personal computer casing without the use of screws is provided which overcomes the deficiency of the prior art.

It is apparent that although the invention has been described in connection with a preferred embodiment, those skilled in the art may make changes to certain features of the preferred embodiment without departing from the spirit and scope of the invention as defined in the appended claims.

What is claimed is:

1. A combination of a front panel and a computer casing, comprising:

a casing comprising a base casing, a cover casing disposed on said base casing, said cover casing having a front extensions, and a front side member connected to said base casing and extending between said base casing and said cover casing; and a front panel comprising a top flange and a bottom flange, a plurality of upper hooking members each having a free end with an upward projecting hook, said upper hooking members extending from said upper flange to be received within respective upper slots on said front extension of said cover casing, and a plurality of lower hooking members on said bottom flange each having a free end with a downward projecting hook, said lower hooking members extending from said bottom flange to be received within respective lower openings on said front side member, whereby said upper and lower hooking members secure said front panel on said casing.

2. The combination as claimed in claim 1 wherein said front panel comprises an inclined surface formed between said panel body and said bottom flange with a plurality of notches formed thereon, on each of which notches each of said lower hooking members is formed and extending therefrom.

3. The combination as claimed in claim 2 wherein the number of said notches is two and each of said lower hooking members comprising a resilient strip-like portion extending from said notch so as to be depressible by a slender tool or a finger entering through said notch to have the hook thereof disengage from said corresponding lower opening.

4. The combination as claimed in claim 1 further comprising a plurality of guiding tabs formed on the front side member of said base casing and spaced in a line, corresponding to said bottom flange, so as to have respective lower edge thereof rest on and thus tightly abut against said bottom flange, each of said guiding tabs further comprising a chamfered edge so formed as to guide said bottom flange into abuttingly contact with the lower edges of the guiding tabs during assembly and thus securing said front panel in position.

5. The combination as claimed in claim 5 wherein said front panel further comprises two opposite side flanges to define, together with said top and bottom flanges, a recess for receiving therein the front side portion of said base casing, said side flanges respectively forming a connection with said panel bottom on which at least a notched support member is formed with a notch thereon to receive therein a side tab formed on the front side portion of said base casing for more securely supporting said front panel on said computer casing.

* * * * *